(12) United States Patent
Lee et al.

(10) Patent No.: US 7,211,456 B2
(45) Date of Patent: May 1, 2007

(54) METHOD FOR ELECTRO-LUMINESCENT DISPLAY FABRICATION

(75) Inventors: Hsin-Hung Lee, Taipei (TW); Wei-Pang Huang, Hsinchu (TW); Chun-Hsiun Chen, Sansia Township, Taipei County (TW)

(73) Assignee: AU Optronics Corporation, Hsinchu (TW)

( * ) Notice: Subject to any disclaimer, the term of this patent is extended or adjusted under 35 U.S.C. 154(b) by 124 days.

(21) Appl. No.: 10/888,692

(22) Filed: Jul. 9, 2004

(65) Prior Publication Data

US 2006/0008931 A1    Jan. 12, 2006

(51) Int. Cl.
*H01L 21/00* (2006.01)
(52) U.S. Cl. ..................... 438/30
(58) Field of Classification Search ................ 438/30
See application file for complete search history.

(56) References Cited

U.S. PATENT DOCUMENTS

| | | | |
|---|---|---|---|
| 6,103,558 A | 8/2000 | Yamanaka et al. | 438/166 |
| 6,307,213 B1 * | 10/2001 | Huang et al. | 257/50 |
| 6,351,010 B1 | 2/2002 | Yamanaka et al. | 257/350 |
| 6,351,078 B1 | 2/2002 | Wang et al. | 315/169.3 |
| 6,392,810 B1 | 5/2002 | Tanaka | 359/622 |
| 6,492,190 B2 | 12/2002 | Yamanaka et al. | 438/30 |
| 6,492,778 B1 | 12/2002 | Segawa | 315/169.3 |
| 6,850,000 B1 * | 2/2005 | Huang et al. | 313/500 |
| 2002/0162998 A1 * | 11/2002 | Okuda et al. | 257/59 |
| 2004/0058146 A1 * | 3/2004 | Kawamura et al. | 428/323 |
| 2004/0074584 A1 * | 4/2004 | Kishimoto | 156/67 |

FOREIGN PATENT DOCUMENTS

JP    10-289785    10/1998

* cited by examiner

*Primary Examiner*—B. William Baumeister
*Assistant Examiner*—Matthew L. Reames
(74) *Attorney, Agent, or Firm*—Duane Morris LLP (57) ABSTRACT

The present invention discloses a method for fabricating a pixel area of an electro-luminescent display device. At least one buffer layer is formed on a substrate. An etch stop layer is formed on the buffer layer. At least one intermediate layer is formed over the etch stop layer. The intermediate layer is etched to expose the etch stop layer, which has an etch rate substantially selective against that of the intermediate layer. The etch stop layer is etched to expose the buffer layer, which has an etch rate substantially selective against that of the etch stop layer, thereby improving an level uniformity of the exposed buffer layer.

21 Claims, 8 Drawing Sheets

METHOD FOR ELECTRO-LUMINESCENT DISPLAY FABRICATION

BACKGROUND

The present invention relates to an electro-luminescent display, and more particularly to a method for manufacturing a pixel area of the same.

Flat display technology has been significantly advanced recently, in part because manufacturing thin film transistors on a substrate, such as glass, has become a mature skill. This facilitates the development of active matrix type display devices. In addition to liquid crystal materials, which need a backlight source, an electro-luminescent device, such as an organic light emitting diode (OLED) that can emit light itself, is intensively researched. Because of the self light emission, a display equipped with electro-luminescent devices is brighter than a backlit liquid crystal display.

Figure 1:
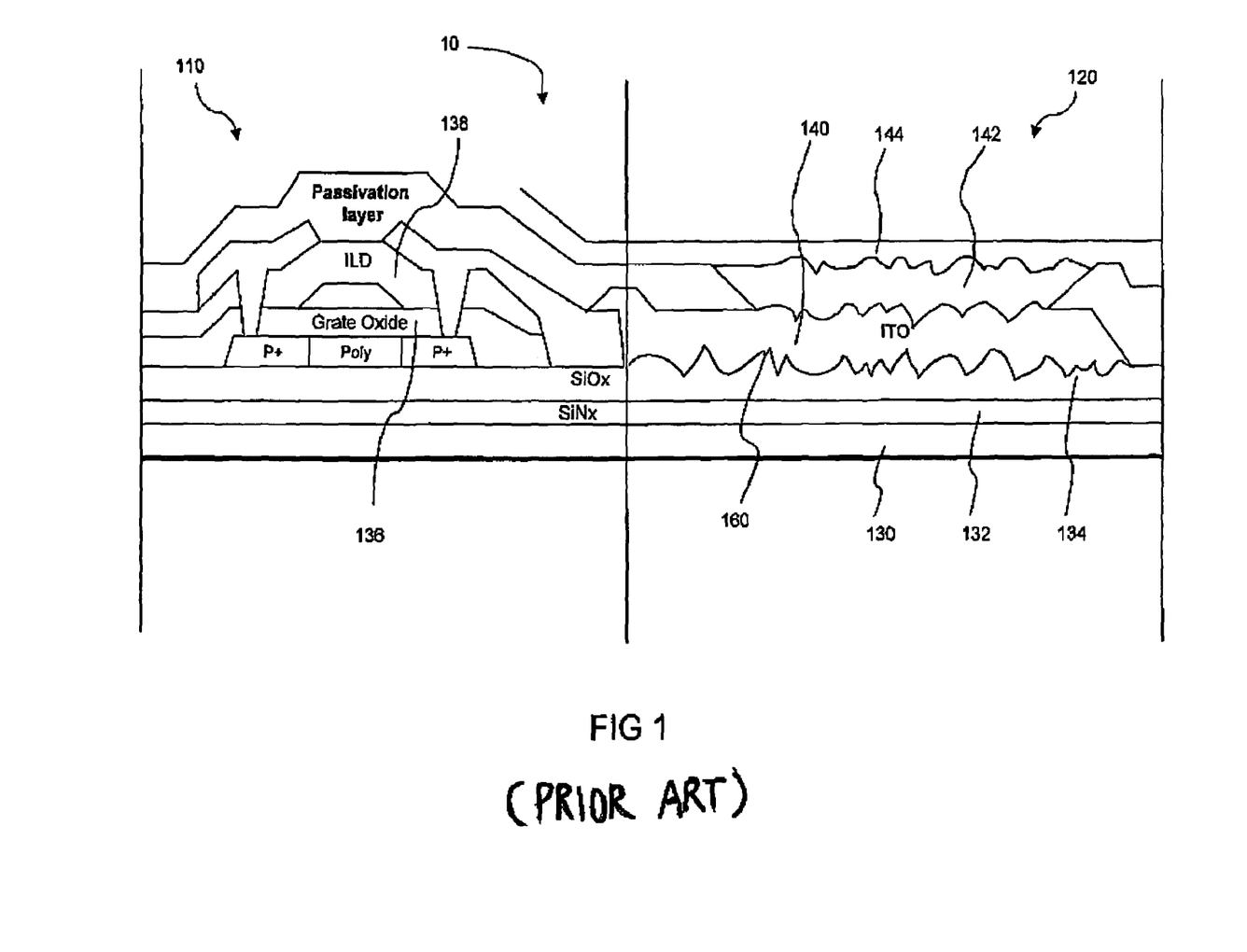
FIG. 1 illustrate a cross-sectional view of a conventional electro-luminescent display device.

FIG. 1 is a cross-sectional view of a conventional electro-luminescent display device 10 with a thin film transistor (TFT) area 110 and a pixel area 120. The electro-luminescent display device 10 includes a substrate 130, a silicon nitride buffer layer 132, a silicon oxide buffer layer 134, gate oxide layer 136, inter-layer dielectric (ILD) layer 138, indium-tin-oxide (ITO) layer 140, organic light-emitting layer 142, and cathode layer 144.

In the process of forming the electro-luminescent display 10, the gate oxide layer 136 and the ILD layer 138 originally deposited in the pixel area 120 need to be removed for they may reduce light-emission intensity. A photolithography step is performed to define a window exposing a part of the oxide layer 136 and the ILD layer in the pixel area 120. The exposed part is then etched away to expose the underlying silicon oxide buffer layer 134 in the pixel area 120. The ITO layer 140 and the organic light-emitting layer 142 are subsequently deposited thereon to from a structure as shown in this figure.

This conventional fabrication process has a drawback of poor level uniformity. Because the etch selectivity of the gate oxide layer 136 and its underlying silicon oxide buffer layer 134 is very low, it is difficult to properly control the end point of the etching process. This would cause an uneven surface 160 of the silicon oxide buffer layer 134 in the pixel area 120. As a result, the subsequently formed ITO layer 140 and organic light-emitting layer 142 would also have uneven surfaces. This greatly degrades the performance of the electro-luminescent display device 10.

What is needed is an electro-luminescent display fabrication process with an improved level uniformity of the layers formed in a pixel area.

SUMMARY

The present invention discloses a method for fabricating a pixel area of an electro-luminescent display device. At least one buffer layer is formed on a substrate. An etch stop layer is formed on the buffer layer. At least one intermediate layer is formed over the etch stop layer. The intermediate layer is etched to expose the etch stop layer, which has an etch rate substantially selective against that of the intermediate layer. The etch stop layer is etched to expose the buffer layer, which has an etch rate substantially selective against that of the etch stop layer, thereby improving an level uniformity of the exposed buffer layer.

The construction and method of operation of the invention, however, together with additional objects and advantages thereof will be best understood from the following description of specific embodiments when read in connection with the accompanying drawings.

DESCRIPTION

This invention discloses a fabrication process for producing an electro-luminescent display device with improved level uniformity for layers formed in its pixel area. An etch stop layer is formed between a first buffer layer and its underlying second buffer layer in the pixel area. The etch stop layer has an etch rate substantially selective against that of the first buffer layer and the second buffer layer. Due to the etch stop layer, etching of the first buffer layer is easy to control, without damaging the underlying gate oxide layer. Subsequently, the etch stop layer can be removed, while the surface of the second buffer layer remains substantially even. This improves the overall performance of the electro-luminescent display device.

Figure 2A:
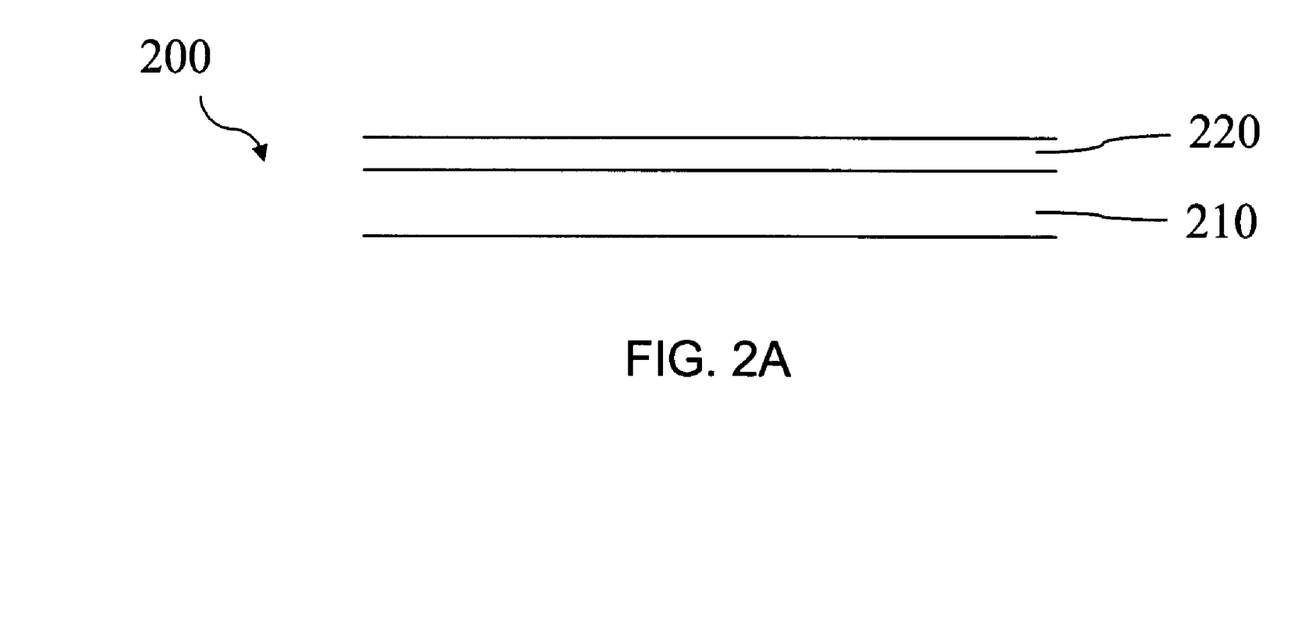
FIG. 2A through 2I illustrate a process of forming a pixel area of an electro-luminescent display device with improved level uniformity, in accordance with one embodiment of the present invention.
Figure 2B:
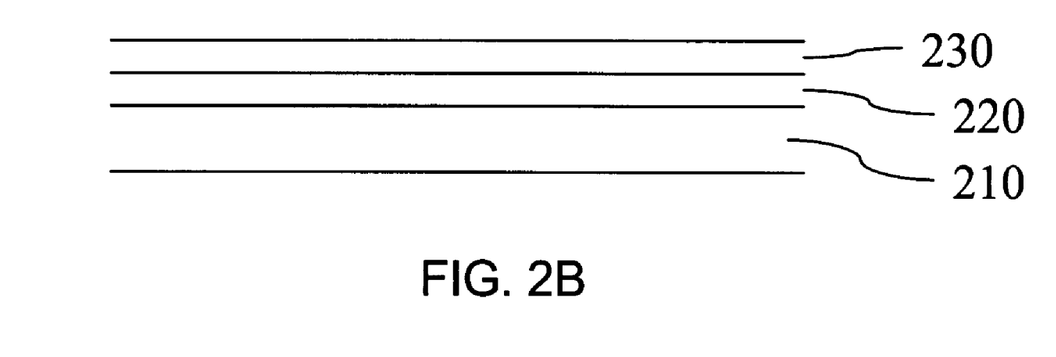

FIGS. 2A through 2H illustrate a process flow for fabricating a pixel area 200 of an electro-luminescent display device, according to an embodiment of the present invention. In FIG. 2A, a first buffer layer 220 is formed on a substrate 210 by a process, such as chemical vapor deposition (CVD), low pressure chemical vapor deposition (LPCVD) and plasma enhanced chemical vapor deposition (PECVD). The first buffer layer 220 is made of a dielectric material, such as silicon nitride ($SiN_x$). The substrate 210 includes, but not limited to, glass, quartz, and polymer materials. In FIG. 2B, a second buffer layer 230 is formed above the first buffer layer 220 by a process, such CVD, LPCVD and PECVD. The second buffer layer 230 may be a silicon oxide ($SiO_x$) layer. In a broader view, the first buffer layer 220 and the second buffer layer 230 may extend beyond the pixel area 200 and over a TFT area (not shown).

Figure 2C:
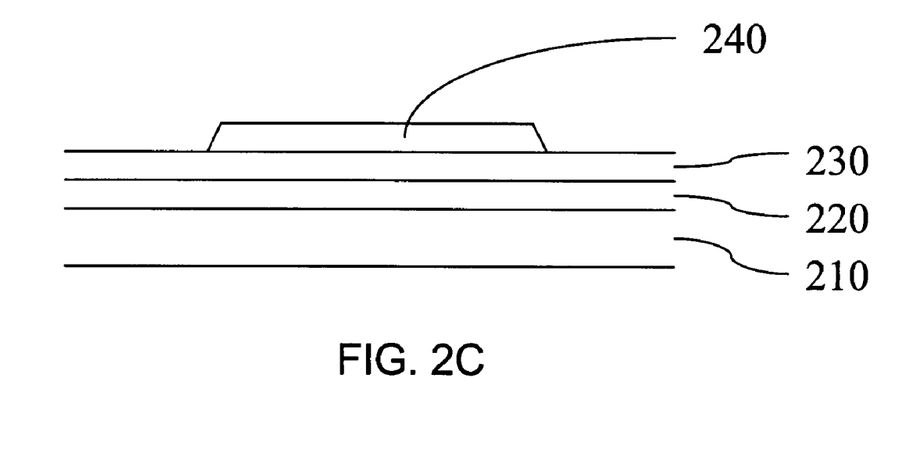

In FIG. 2C, an etch stop layer 240 is formed on the second buffer layer 230. The etch stop layer 240 may be a polysilicon layer with an approximate thickness of 500 angstroms. This forming of the etch stop layer 240 can be done by two sub-steps. The first sub-step is to deposit a layer of polysilicon on both the pixel area 200 and the TFT area. The second sub-step is to etch back the polysilicon layer, and use the part of the polysilicon layer remains in the TFT area to form source and drain electrodes. The part of the polysilicon layer remaining in the pixel area 200 serves as the etch stop layer 240. Because the etch stop layer 240 and the source and drain are made out of the same polysilicon layer, no additional mask and cost are incurred. While a polysilicon layer is used as an example for illustrative purposes, the etch stop layer can be any material that is highly selective against the first and second buffer layers.

Figure 2D:
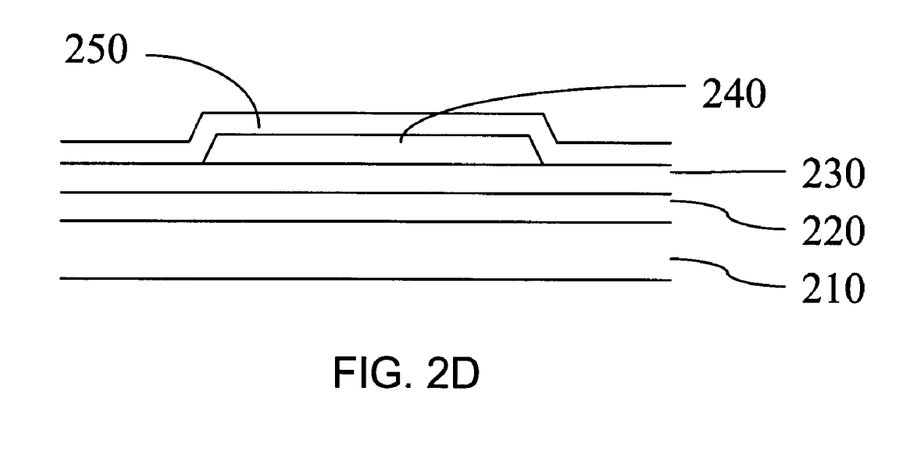

In FIG. 2D, a first intermediate layer 250 is formed over the etch stop layer 240. The first intermediate layer 250 may be a silicon oxide ($SiO_x$) layer with an approximate thickness of 1,000 angstroms. In a broader view, the first intermediate layer 250 ma extend beyond the pixel area 200 into the TFT area (not shown). In this embodiment, the part first intermediate layer 250 in the TFT area is used as a gate oxide layer.

Figure 2E:
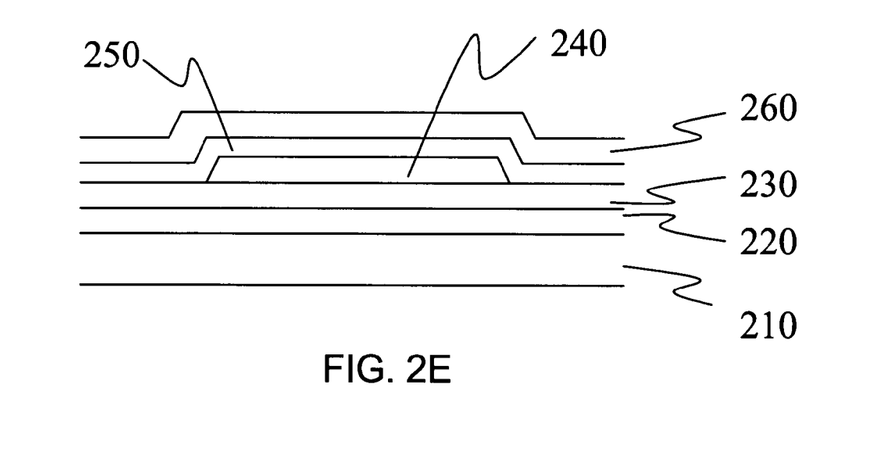

In FIG. 2E, a second intermediate layer 260 is formed over the first intermediate layer 250. The second intermediate layer 260 may be a silicon oxide ($SiO_x$) layer with an approximate thickness of 2,500 angstroms. The second intermediate layer 260 may also extend beyond the pixel area 200 into the TFT area. In this embodiment, the second intermediate layer 260 serves as inter layer dielectric (ILD).

Figure 2F:
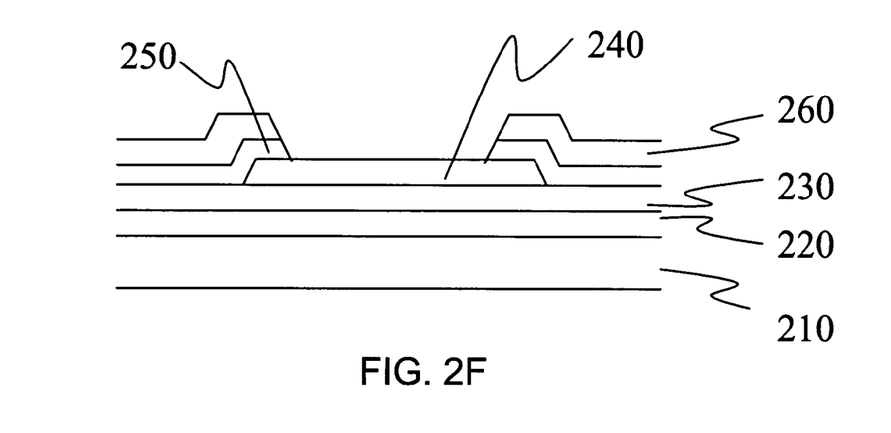

In FIG. 2F, both the first intermediate layer 250 and the second intermediate layer 260 are etched back by a process such as wet etching and dry etching, using etchants that have a high etch selectivity for the first intermediate layer 250 and the second intermediate layer 260 as opposed to the etch stop layer. For example, buffered oxide etchants (BOE), which is a mixture of Hydrofloride and ammonium floride (HF and NH4F), are used to etch a silicon oxide based first intermediate layer 250 and the second intermediate layer 260 with the etch stop layer 240 being made of polysilicon. Because BOE has a high etch selectivity to silicon oxide ($SiO_x$) as opposed to polysilicon, the first intermediate layer 250 and the second intermediate layer 260 can be removed without substantially damaging the level uniformity of etch stop layer 240, where Uniformity=(maximum thickness−minimum thickness)/(maximum thickness+minimum thickness)×100%. In other words, the first intermediate layer 250 can be over etched. In this example, the etch ratio of the silicon oxide and polysilicon is greater than 20. As such, the etch end point can be easily determined by monitoring the concentration of the reactants and/or products of the reaction.

Figure 2G:
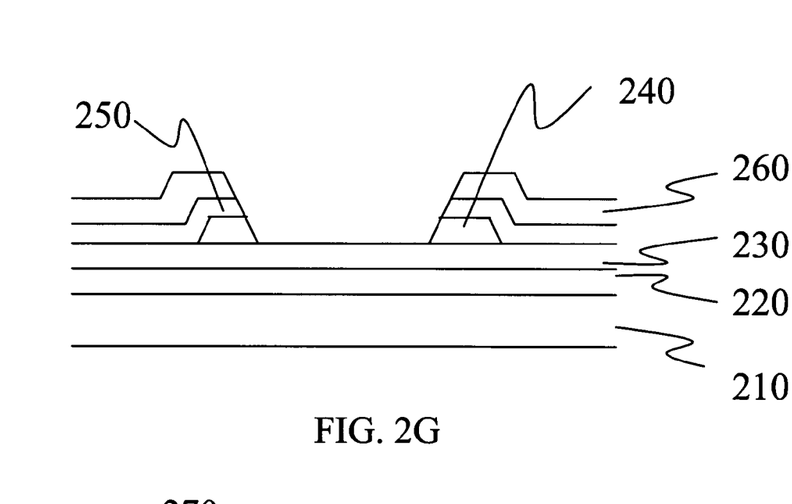

In FIG. 2G, the etch stop layer 240 is etched back by etchants highly selective between the etch stop layer 240 and the underlying second buffer layer 230. For example, chloride plasma is used to etch a polysilicon etch stop layer 240, as the second buffer layer 230 is made of silicon oxide based materials. Because the chloride plasma has a high etch selectivity between silicon oxide and polysilicon, the etch stop layer 240 can be etched without substantially damaging the level uniformity of the second buffer layer 230. In other words, the first intermediate layer 250 can be over etched. In this example, the etch ratio of the silicon oxide and polysilicon is greater than 20. As such, the level uniformity of the second buffer layer 230 is improved.

The following table provides experimental results of the uniformity of the second buffer layer measured by scanning electron microscope (SEM) cross-section in a 200 mm×200 mm substrate with a first buffer layer thickness of approximately 500 angstroms.

| Thickness (angstroms) of the second buffer layer ($SiO_x$) | 500 | 1000 | 1500 | 2000 |
|---|---|---|---|---|
| Uniformity of the second buffer layer ($SiO_x$) | 2.58% | 5.01% | 1.74% | 7.06% |

Figure 2H:
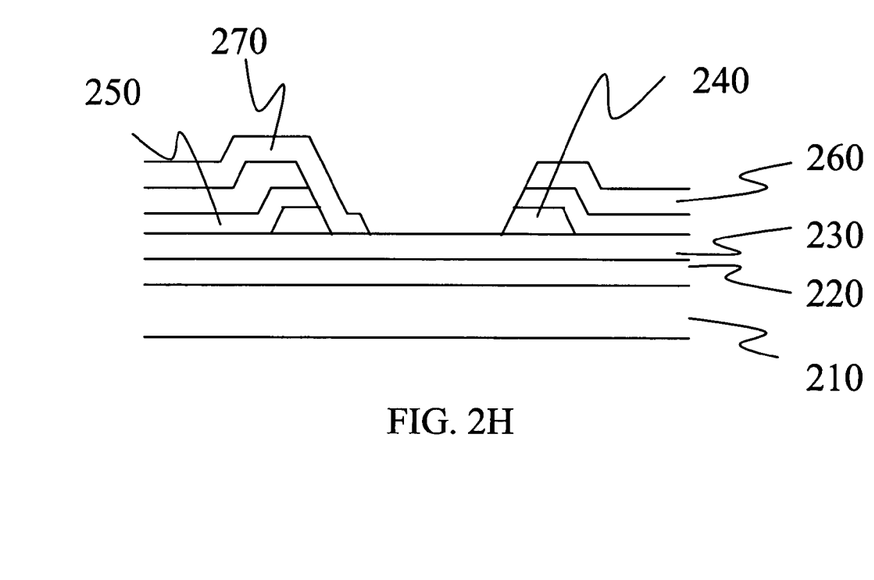
Figure 2I:
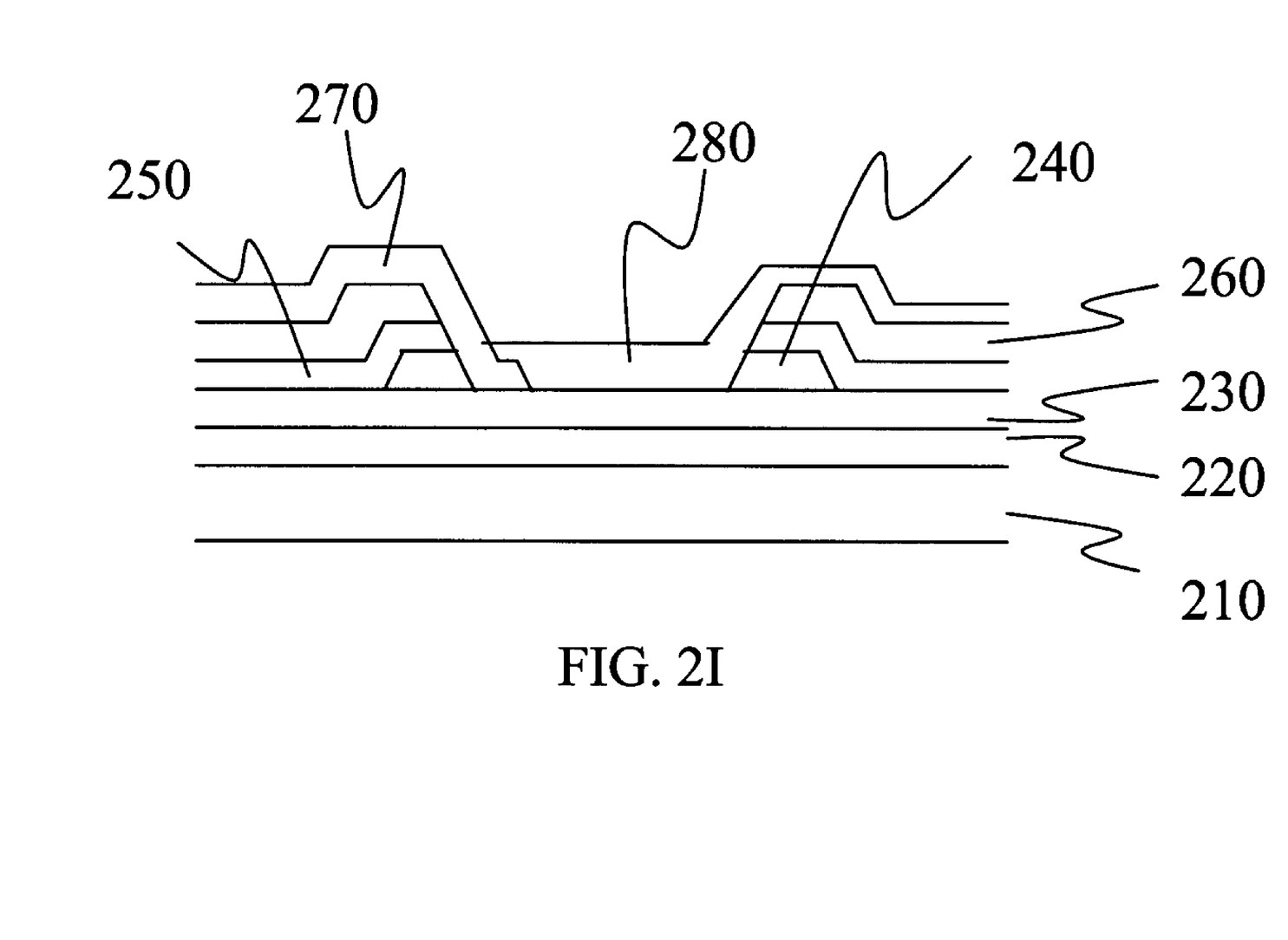

In FIG. 2H, a conductive layer 270 is formed in contact with source and drain electrodes in the TFT area. In FIG. 2I, a pixel electrode layer 280, such as an ITO layer, is formed over the second buffer layer 230 and the second intermediate layer 260. The surface of the pixel electrode layer is substantially even, so that the performance of the electro-luminescent display device as a whole is improved.

FIGS. 3A through 3D illustrate a process flow for fabricating a pixel area 300 of an electro-luminescent display device, in accordance with another embodiment of the present invention.

Figure 3A:
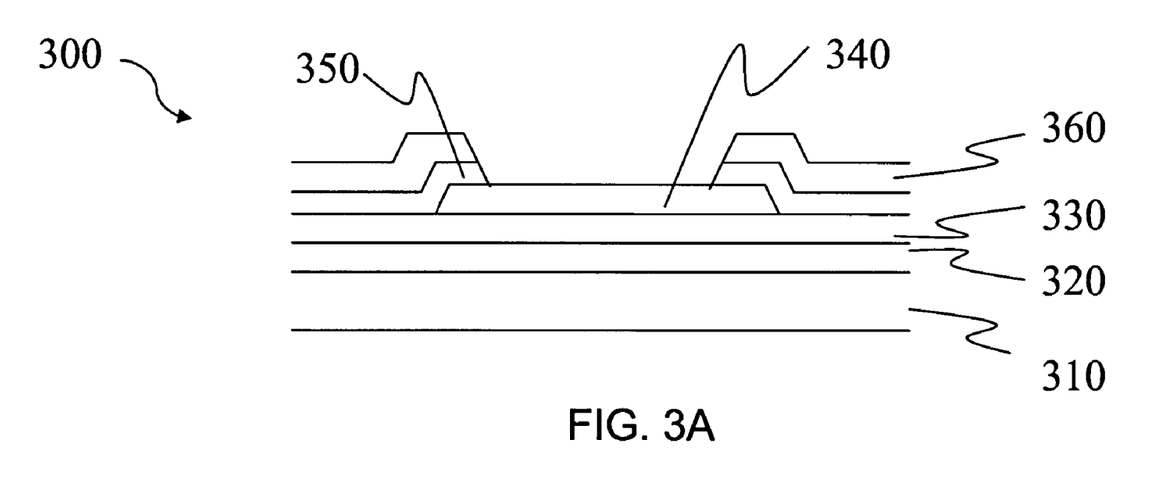
FIG. 3A through 3D illustrate a process of forming a pixel area of an electro-luminescent display device with improved level uniformity, in accordance with another embodiment of the present invention.
Figure 3B:
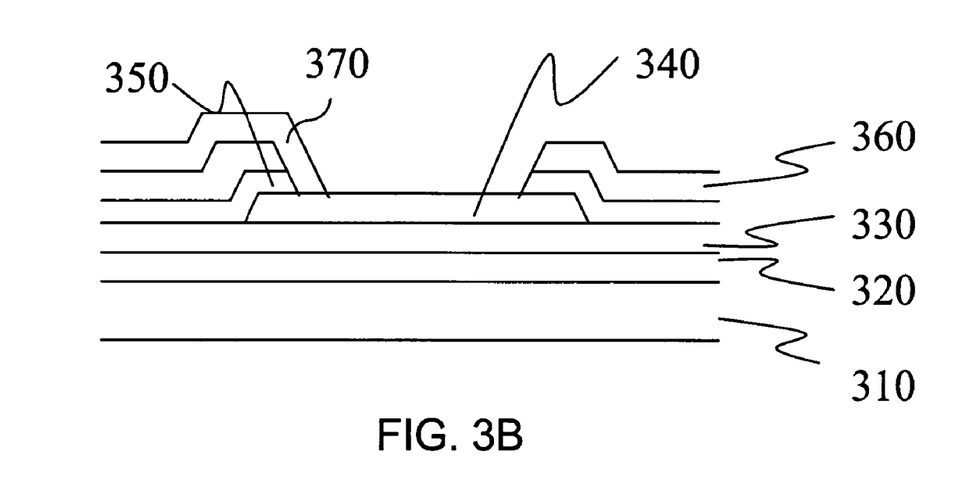
Figure 3C:
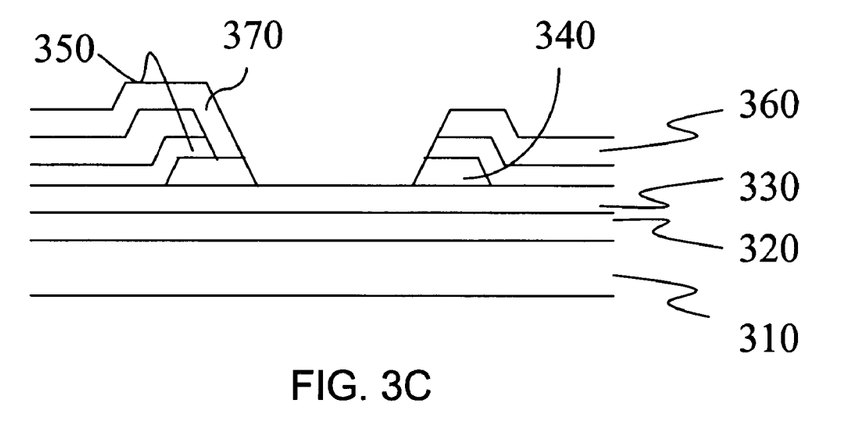
Figure 3D:
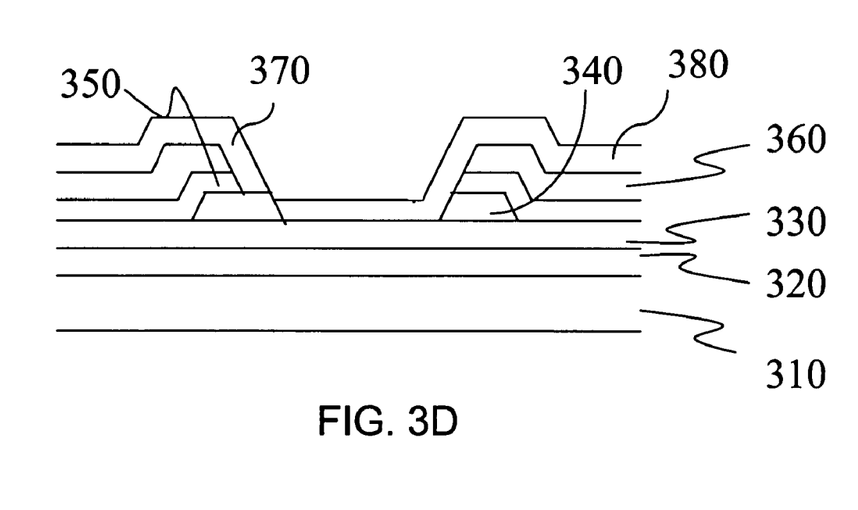

In FIG. 3A, a structure in the pixel area 320 is formed by similar process described in FIGS. 2A through 2F. The structure includes a substrate 310, first buffer layer 320, second buffer layer 320, etch stop layer 340, first intermediate layer 350 and second intermediate layer 360. In FIG. 3B, a conductive layer 370 is formed partially over the second intermediate layer 350 and the etch stop layer 340. In FIG. 3C, the part of the etch stop layer 340 uncovered by the conductive layer 370 is etched off. Due to the high etch selectivity, the etching would not substantially the level uniformity of the underlying second buffer layer 350. Then, a pixel electrode layer 380 is formed over the exposed part of the second buffer layer and the second intermediate layer 360, as shown in FIG. 3D.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for fabricating at least one pixel area of an electro-luminescent display device, comprising:
   forming at least one buffer layer on a substrate;
   forming an etch stop layer on the buffer layer in a pixel area;
   forming at least one intermediate layer over the etch stop layer;
   etching the intermediate layer to expose the etch stop layer, which has an etch rate substantially selective against that of the etch stop layer;
   forming a conductive layer over a portion of the etch stop layer, wherein the conductive layer is in contact with a transistor; and
   forming a pixel electrode layer over the exposed buffer layer and in contact with the conductive layer.

2. A method for fabricating at least one pixel area of an electro-luminescent display device, comprising:
   forming at least one buffer layer on a substrate;
   forming an etch stop layer on the buffer layer in a pixel area;
   forming a transistor on the buffer layer;
   forming at least one intermediate layer over the etch stop layer;
   etching the intermediate layer to expose the etch stop layer, which has an etch rate substantially selective against that of the etch stop layer;
   etching the etch stop layer to expose the buffer layer, which has an etch rate substantially selective against that of the etch stop layer;
   forming a conductive layer over the intermediate layer and in contact with the transistor; and
   forming a pixel electrode layer over the exposed buffer layer and in contact with the conductive layer.

3. A method for fabricating at least one pixel area of an electro-luminescent display device, comprising:
- forming at least one buffer layer on a substrate;
- forming an etch stop layer on the buffer layer in a pixel area;
- forming at least one intermediate layer over the etch stop layer;
- forming a conductive layer over a portion of the etch stop layer, wherein the conductive layer extends to being in contact with a transistor;
- etching the intermediate layer to expose the etch stop layer, which has an etch rate substantially selective against that of the intermediate layer;
- etching the etch stop layer to expose the buffer layer, which has an etch rate substantially selective against that of the etch stop layer; and
- forming a pixel electrode layer over the exposed buffer layer, wherein the pixel electrode layer is in contact with the conductive layer.

4. The method of claim 3 further comprising forming a pixel electrode layer over the exposed buffer layer, after etching the etch stop layer.

5. The method of claim 3 wherein an etch ratio between the intermediate layer and the etch stop layer is greater than 20.

6. The method of claim 3 wherein an etch ratio between the etch stop layer and the buffer layer is greater than 20.

7. The method of claim 3 wherein the buffer layer is a silicon oxide (SiOx) layer.

8. The method of claim 3 wherein the etch stop layer is a polysilicon layer.

9. The method of claim 3 wherein the intermediate layer is a silicon oxide layer.

10. The method of claim 3 wherein the intermediate layer is over-etched.

11. The method of claim 3 wherein the etch stop layer is over-etched.

12. The method of claim 3 wherein the level uniformity of the buffer layer is approximately less than 8%, after etching the etch stop layer.

13. A method for fabricating at least one pixel area of an electro-luminescent display device, comprising:
- forming a first buffer layer on a substrate;
- forming a second buffer layer on the first buffer layer;
- forming an etch stop layer on the second buffer layer in a pixel area;
- forming a first intermediate layer on the etch stop layer;
- forming a second intermediate layer on the first intermediate layer;
- etching the first intermediate layer and the second intermediate layer to expose the etch stop layer, which has an etch rate substantially selective against that of the first intermediate layer;
- etching the etch stop layer to expose the second buffer layer, which has an etch rate substantially selective against that of the etch stop layer;
- forming a conductive layer over a portion of the second buffer layer, wherein the conductive layer extends to being in contact with a transistor; and
- forming a pixel electrode layer over the exposed second buffer layer and in contact with the conductive layer.

14. The method of claim 13 wherein an etch ratio between the first intermediate layer and the etch stop layer is greater than 20.

15. The method of claim 13 wherein an etch ratio between the etch stop layer and the second buffer layer is greater than 20.

16. The method of claim 13 wherein the second buffer layer is a silicon oxide (SiOx) layer.

17. The method of claim 13 wherein the etch stop layer is a polysilicon layer.

18. The method of claim 13 wherein the first intermediate layer is a silicon oxide layer.

19. The method of claim 13 wherein a buffered oxide etchant is used to etch the first intermediate layer.

20. The method of claim 13 wherein a chloride plasma is used to etch the etch stop layer.

21. A method for fabricating a pixel area of an electro-luminescent display device, comprising:
- forming at least one silicon-oxide-based buffer layer on a substrate;
- forming a polysilicon-based etch stop layer on the buffer layer in a pixel area;
- forming at least one silicon-oxide-based intermediate layer over the etch stop layer;
- etching the intermediate layer to expose the etch stop layer, wherein an etch ratio between the intermediate layer and the etch stop layer is greater than 20;
- etching the etch stop layer to expose the buffer layer, wherein an etch ratio between the etch stop layer and the buffer layer is greater than 20, thereby improving a level uniformity of the exposed buffer layer;
- forming a conductive layer over a portion of the buffer layer, wherein the conductive layer extends to being in contact with a transistor; and
- forming a pixel electrode layer over the exposed buffer layer and in contact with the conductive layer.

* * * * *